Figure 1:
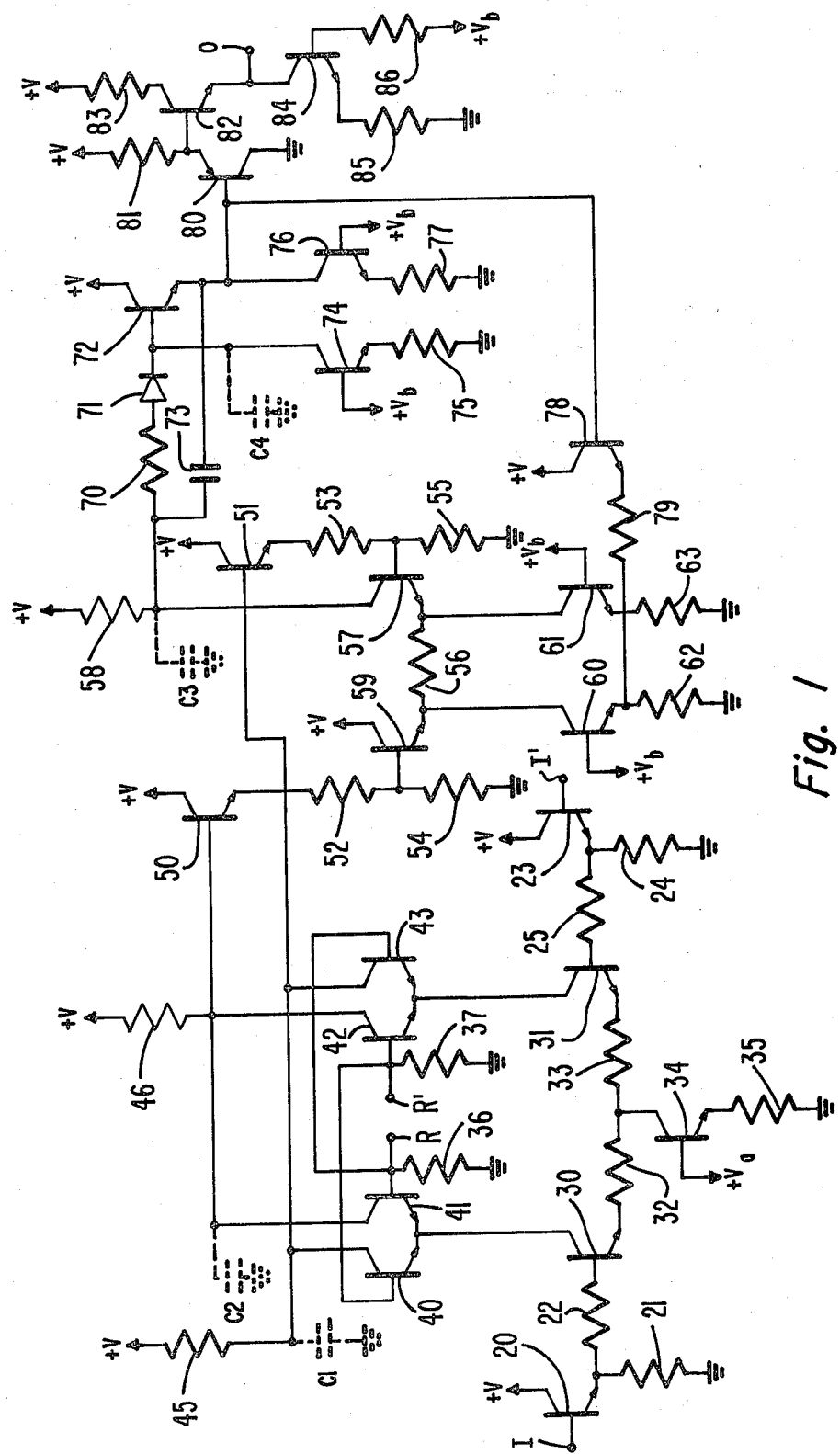

United States Patent [19]

Harford

[11] 4,367,491

[45] Jan. 4, 1983

[54] VIDEO SIGNAL RECOVERY SYSTEM

[75] Inventor: Jack R. Harford, Flemington, N.J.

[73] Assignee: RCA Corporation, New York, N.Y.

[21] Appl. No.: 270,019

[22] Filed: Jun. 3, 1981

[51] Int. Cl.$^3$ ............................................. H04N 5/44
[52] U.S. Cl. .................................... 358/188; 455/214; 455/333
[58] Field of Search ............................ 358/188, 195.1; 455/205, 307, 214, 332, 333, 334, 323; 329/50

[56] References Cited

U.S. PATENT DOCUMENTS

| | | | |
|---|---|---|---|
| 3,577,008 | 5/1971 | Craft | 358/188 |
| 3,914,704 | 10/1975 | Craft | 330/18 |
| 4,052,673 | 10/1977 | Herzog | 455/333 |
| 4,253,118 | 2/1981 | Flasza | 358/188 |

OTHER PUBLICATIONS

Philips Technical Information Brochure (No. 034; 1977), Entitled "TDA 2540 and TDA 2541-New Vision IF ICs".
"Active Filter Cookbook," by D. Lancaster, published in 1975 by Howard W. Sams & Co., Inc., pp. 124-125.

*Primary Examiner*—Tommy P. Chin
*Attorney, Agent, or Firm*—Eugene M. Whitacre; Paul J. Rasmussen; William H. Meagher

[57] ABSTRACT

Sync-positive and sync-negative video signals appearing across load resistors of synchronous video detector employing array of NPN transistors are coupled via respective voltage dividers to complementary inputs of differential amplifier employing NPN transistors. Signals appearing across load resistor of amplifier are coupled via an active filter to video signal output terminal. Detector load circuits, amplifier load circuit, and active filter each provide high frequency roll off with break point lying between desired video passband and second subharmonic of picture carrier intermediate frequency. Active filter provides response boost within high end of video passband, and response null in vicinity of picture carrier intermediate frequency. Level shift circuit utilizes series resistance of active filter. Differential amplifier has current source responsive to amplifier output to avoid cut off of amplifier transistor receiving sync-negative drive.

8 Claims, 2 Drawing Figures

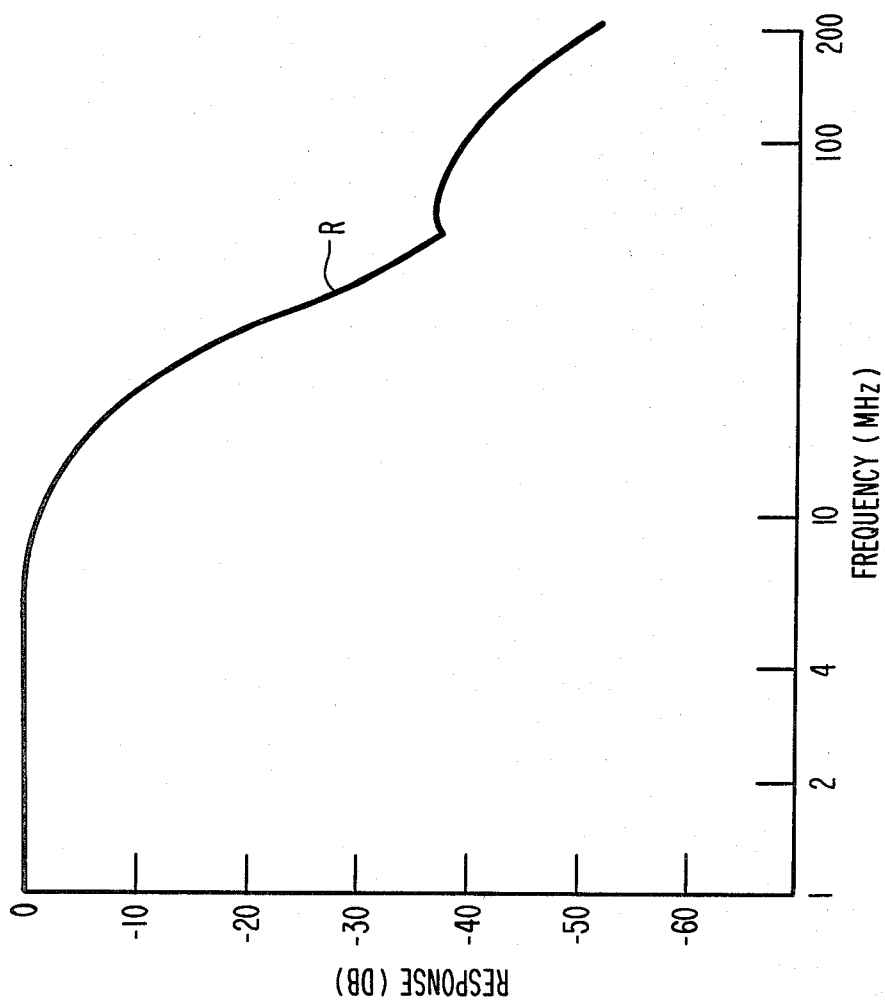

VIDEO SIGNAL RECOVERY SYSTEM

The present invention relates generally to systems for recovering video signals from modulated IF carrier waves, and particularly to video signal recovery systems, suitable for realization in integrated circuit form, which employ synchronous detection in a manner providing advantageous suppression of detection products with frequencies falling outside the desired video band.

In a currently popular approach to the design of a television receiver, an integrated circuit is employed in which circuits for implementing such receiver functions as IF amplification, synchronous video detection, video amplification, and automatic gain control (among others), appear on a common substrate. An advantageous form for the synchronous video detector in such integrated circuits comprises a signal multiplier employing an array of NPN transistors, with the typical array involving a three-deep stacking of transistors and development of detector output signals across load resistors connected between the collectors of transistors in the "upper" rank of the array and the positive terminal ("B+") of an associated operating potential supply. For an example of such signal multiplier use, reference may be made to a 1977 Philips Technical Information brochure (No. 034) entitled "TDA 2540 and TDA 2541—New Vision IF ICs".

Level shifting and amplification of the detector output signals is desirably effected by a video amplifier section of the integrated circuit so as to supply to the video signal output terminal of the IC an output video signal having both adequate swing (e.g., 2.6 volts) and convenient range location (e.g., 3.1 volts to 5.7 volts) remote from the B+ potential level. In an approach exemplified by the integrated circuits described in the aforementioned brochure, such level shifting and amplification may be effected conveniently through the use of PNP transistors disposed in a grounded-base amplifier configuration with collector loads returned to the negative terminal (e.g., ground) of the supply.

A significant problem, however, is posed with such use of PNP transistors for video amplification purposes, because of the limited frequency response characteristics of such transistors and the difficulty of obtaining a high yield of IC's free of undesired roll off of the higher frequencies in the video pass band by the PNP devices thereon. Moreover, even where the roll off provided by the devices is such as to permit acceptable performance within the desired passband, the break point (i.e., that point in the roll off exhibiting a 3 db drop in response relative to low frequency response) is sufficiently close to the passband as to require, as a practical matter, very wideband design for the rest of the video circuits of the IC to avoid compromising performance within the passband. Illustratively, in compliance with such a wideband design requirement, a relatively low detector load resistance value (e.g., 1.3 kilohms) will be employed so that break points associated with the demodulator load circuits will lie well above the picture carrier intermediate frequency.

A consequence of the above-described approach to video signal development and processing can be unsatisfactory suppression of various modulation products which are subject to appearance in the signal multiplier output in addition to the desired video signals, and which have frequencies lying outside the video band. One such modulation product is a component at the fundamental picture carrier intermediate frequency itself. Inadequate suppression of this component can result, for example, in stability problems for the IF amplifier. Other such modulation products are the even harmonics of the picture carrier intermediate frequency.

In the United States, for example, inadequate suppression of the fourth harmonic component can result in troublesome interference patterns in the displayed picture during Channel 8 reception. Radiation of this harmonic (which falls 1.75 MHz. above the RF carrier frequency assigned for Channel 8 broadcasting) from leads coupled to the detector IC is subject to pickup at the tuner input, with the disturbing interference a natural consequence unless adequate suppression keeps the radiation level very low. With regard to this problem, one must be concerned not only with the fourth harmonic level delivered to the video signal output terminal of the IC, but also with the level of the fourth harmonic component subject to delivery to the B+ lead, for example.

In accordance with the principles of the present invention, an improved video signal recovery system is obtained by use of circuitry in which the requisite level shifting and amplification of the synchronous detector's output is achieved without need for the PNP amplifiers of the prior art arrangement discussed above. A plurality of networks in cascade (associated with NPN devices) are provided with roll off characteristics having break points advantageously positioned between the desired video passband and the second subharmonic of the picture carrier intermediate frequency, to provide an overall video response characteristic with an accelerated roll off beyond the desired video passband. Use of a relatively large resistance value for the detector load resistors establishes the detector load circuits as the initial one of the roll off providing networks, with benefits obtained in reduced delivery of undesired signal components to the B+ lead as well as a contribution to suppression of such components at the video signal output terminal. With one of the roll off providing networks realized in the form of an active filter, an opportunity is presented to obtain a response boost within the high end of the video passband, as well to obtain a response null, which is desirably positioned in the vicinity of the picture carrier intermediate frequency.

In accordance with an illustrative embodiment of the present invention, push-pull video outputs from respective detector load circuits of the above-described narrow band nature are applied via buffer emitter-followers to respective resistive voltage dividers. The divider outputs are applied to complementary inputs of an NPN differential amplifier. A single-ended amplifier output is developed across a load resistor coupled to the collector of the amplifier transistor receiving a sync-positive input signal. The resistance value of the amplifier load resistor is sufficiently large to allow the amplifier load circuit to serve as one of the above-described roll off producing networks.

An active filter, responsive to the output of the differential amplifier, serves as the final one of the above-described roll of producing networks, and contributes the above-mentioned response boost within the high end of the video passband and the response null in the vicinity of the picture carrier intermediate frequency. A current source transistor is positioned to draw current through a series resistance of the active filter of a magnitude appropriate to completion of the desired level shift at the output of the active filter.

The respective NPN transistors of the differential amplifier are desirably biased for substantially equal conduction under no-signal conditions. To avoid the possibility of cut off of the amplifier transistor receiving a sync-negative input signal during signal excursions in the black direction, the differential amplifier, pursuant to a further aspect of the present invention, is provided with a feedback controlled current source system. The current source system includes a first current source transistor with its collector electrode connected directly to the emitter of the amplifier transistor receiving sync-negative drive, a second current source transistor with its collector electrode connected directly to the emitter of the amplifier transistor receiving sync-positive drive, and a resistor interconnecting the emitters of the amplifier transistors. A common source resistor supplies current to the emitters of the first current source transistor and a feedback emitter-follower transistor receiving base drive from the output of the active filter. During signal excursions in the black direction, additional current is supplied as needed to keep the amplifier transistor receiving sync-negative drive out of a cutoff condition.

In the accompanying drawings:

FIG. 1 illustrates schematically a portion of a television receiver incorporating a video signal recovery system embodying the principles of the present invention; and FIG. 2 illustrates graphically frequency response characteristics of aid in explaining the operation and advantages of the FIG. 1 system.

In FIG. 1, an array of NPN transistors 30,31,34,40,41,42,43 form a signal multiplier which serves as the synchronous video detector of a television receiver. An emitter-coupled pair of transistors 30,31 have their emitter electrodes interconnected by the series combination of resistors 32 and 33. Transistor 34 serves as a current source for the emitters of transistors 30,31, with its collector electrode connected to the junction of resistors 32 and 33, its emitter electrode returned to ground via a source resistor 35, and its base electrode coupled to a bias potential supply terminal $V_a$. Transistors 40,41 form a second emitter-coupled transistor pair, with their interconnected emitter electrodes driven by the collector of transistor 30. Transistors 42,43 form a third emitter-coupled transistor pair, with their interconnected emitter electrodes driven by the collector of transistor 31.

Push-pull outputs of the receiver's IF amplifier (not illustrated) appear at the respective IF input terminals I, I', and are coupled therefrom to the respective bases of transistors 30,31 via emitter-followers employing NPN transistors 20,23. The emitter electrode of emitter-follower transistor 20 is returned to ground via resistor 21, and coupled to the base of transistor 30 via a (small-valued) resistor 22, while the emitter electrode of emitter-follower transistor 23 is returned to ground via resistor 24, and coupled to the base of transistor 31 via a (small-valued) resistor 25. The collectors of transistors 20,23 are directly connected to the positive terminal (+V) of an operating potential supply.

Push-pull versions of reference carrier waves appear at the respective reference input terminals R,R'. Reference input terminal R is directly connected to the bases of transistors 41 and 43, and is returned to ground via resistor 36. Reference input terminal R' is directly connected to the bases of transistors 40 and 42, and returned to ground via resistor 37. Illustratively, the reference carrier waves are derived from a reference amplifier (not illustrated) responding to the output of the receiver's IF amplifier. The reference amplifier may, for example, be of the type shown in the aforementioned Philips brochure.

The interconnected collector electrodes of transistors 40 and 43 are connected via a first load resistor 45 to the +V supply terminal, while the interconnected collector electrodes of transistors 41 and 42 are connected via a second load resistor 46 to the +V supply terminal. A video signal of a first polarity, with sync extending in the positive direction, is developed across load resistor 45, and coupled to the base of an NPN emitter-follower transistor 51. A video signal of the opposite polarity (with sync extending in the negative direction) is developed across load resistor 46 and is coupled to the base of an NPN emitter-follower transistor 50. The collectors of the emitter-follower transistors 50,51 are directly connected to the +V supply terminal.

A voltage divider for the sync-positive video signal is formed by a pair of resistors 53,55 connected in series between the emitter of transistor 51 and ground. A matching voltage divider for the sync-negative video signal is formed by a pair of resistors 52,54 connected in series between the emitter of transistor 50 and ground. The respective outputs of the voltage dividers are applied to complementary inputs of a differential amplifier employing NPN transistors 57,59, with the base of transistor 57 driven by the sync-positive video signal appearing at the junction of resistors 53 and 55, and with the base of transistor 59 driven by the sync-negative video signal appearing at the junction of resistors 52 and 54. A resistor 56 interconnects the emitters of transistors 57 and 59.

A first NPN current source transistor 60 has its collector electrode directly connected to the emitter of amplifier transistor 59, its base electrode coupled to a bias potential supply terminal $V_b$, and its emitter electrode returned to ground via source resistor 62. A second NPN current source transistor 61 has its collector electrode directly connected to the emitter of amplifier transistor 57, its base electrode coupled to bias potential supply terminal $V_b$, and its emitter electrode returned to ground via a resistor 63. The collector electrode of amplifier transistor 59 is directly connected to the +V supply terminal, while the collector electrode of amplifier transistor 57 is connected to the +V supply terminal via a load resistor 58.

The collector electrode of amplifier transistor 57 is connected via the series combination of resistor 70 and forward-biased diode 71 to the base electrode of an NPN emitter-follower transistor 72, and via a capacitor 73 to the emitter electrode of transistor 72. The collector of transistor 72 is directly connected to the +V supply terminal, while the emitter of transistor 72 is returned to ground via the collector-emitter path of NPN current source transistor 76 in series with a resistor 77. An additional NPN current source transistor 74 has its collector electrode connected to the base of transistor 72, and its emitter electrode returned to ground via resistor 75. The bases of current source transistors 74 and 76 are coupled to bias potential supply terminal $V_b$.

Feedback to the differential amplifier is effected by an NPN transistor 78 disposed as an emitter-follower, with its base electrode directly connected to the emitter of follower transistor 72, its collector electrode directly connected to the +V supply terminal, and its emitter electrode connected via resistor 79 to the emitter of current source transistor 60.

Coupling of the emitter of follower transistor 72 to a video signal output terminal O is effected via a pair of emitter-followers in cascade. The emitter of follower transistor 72 is directly connected to the base of a PNP emitter-follower transistor 80. The collector electrode of transistor 80 is directly connected to ground, while the emitter electrode of transistor 80 is connected to the +V supply terminal via a resistor 81, and is directly connected to the base of an NPN emitter-follower transistor 82. The collector electrode of transistor 82 is connected to the +V supply terminal via a resistor 83, while the emitter electrode of transistor 82 is connected to ground via the collector-emitter path of NPN current source transistor 84 in series with resistor 85. The base of source transistor 84 is connected via resistor 86 to the bias potential supply terminal $V_b$. Video signal output terminal O is directly connected to the emitter electrode of transistor 82.

Illustrative values for elements of the FIG. 1 circuit realized in integrated circuit form are set forth in the table below:

| | |
|---|---|
| Resistors 21,24 | 3.5 kilohms |
| Resistors 22,25 | 12 ohms |
| Resistors 32,33 | 200 ohms |
| Resistor 35 | 555 ohms |
| Resistors 36,37 | 4 kilohms |
| Resistors 45,46 | 5 kilohms |
| Resistors 52,53 | 2.9 kilohms |
| Resistors 54,55 | 5 kilohms |
| Resistor 56 | 1 kilohms |
| Resistor 58 | 4 kilohms |
| Resistor 62 | 650 ohms |
| Resistor 63 | 2.2 kilohms |
| Resistor 70 | 4.5 kilohms |
| Capacitor 73 | 5 picofarads |
| Resistor 75 | 2.9 kilohms |
| Resistor 77 | 3 kilohms |
| Resistor 79 | 3.4 kilohms |
| Resistor 81 | 7.3 kilohms |
| Resistor 83 | 270 ohms |
| Resistor 85 | 400 ohms |
| Resistor 86 | 1 kilohms. |

With the illustrative 5 K values for detector load resistors 45,46, the load resistors cooperate with the associated stray capacitances (represented in the drawing by capacitors C1 and C2) to form frequency selective circuits which exhibit roll offs with break points lying in the range of approximately 15 to 20 MHz. (i.e., above a desired video passband of illustratively 0 to 4.5 MHz., but below the second subharmonic of an illustrative picture carrier intermediate frequency of 45.75 MHz.) A similar break point location is provided for the frequency selective circuit formed by the amplifier load resistor 58 of illustrative 4 K value in cooperation with the stray capacitance associated therewith (represented in the drawing by capacitor C3). A similar break point location is also provided for the active filter formed by elements 70,71,72,73 in cooperation with the driving impedance of the amplifier output circuit and the stray capacitance at the base of transistor 72 (represented in the drawing by capacitor C4). The active filter contributes a moderate response boost within the high end of the video passband, and a response null in the vicinity of the picture carrier intermediate frequency.

The overall response characteristic provided by the FIG. 1 video signal recovery system with the above-listed illustrative circuit element values is shown graphically in FIG. 2 by curve R (plotted in semilog fashion). As shown by curve R, response reduction of approximately 35 db is attained at 45.75 MHz., and response reduction of greater than 45 db is attained at 183 MHz. (the fourth harmonic of 45.75 MHz.). Response within the desired video passband is substantially flat. The cusp in curve R illustrates the effect of the null provision of the active filter.

The relatively large values (e.g., 5 K) for the detector load resistors 45,46 associated with the indicated break point locations aid in reducing delivery of picture carrier frequency and fourth harmonic components to the B+ lead coupling the operating potential supply to the integrated circuit (compared with the delivery associated with wider bandwidth design). These detector load resistor values also shift the no-signal detector output potentials further away from the +V potential, and enhance detector gain to provide a greater video signal swing at the detector outputs (comparison again being with wider bandwidth design). While some signal amplitude loss attends the level shift provided by the voltage dividers for the amplifier inputs, the voltage gain requirements for the amplifier are relatively modest and readily attained with the amplifier load resistor value appropriate for the indicated break point location.

Current drawn by source transistor 74 through resistor 70 of the active filter introduces a level shift of the amplifier output signal which, together with the 2 $V_{be}$ drop provided by diode 71 and the base-emitter path of follower transistor 72, locates the output video signal swing in a convenient range remote from the V+ potential. Illustratively, with a swing of approximately 1 volt between peak white and sync peak at each detector output, the level shift and net amplification introduced thereafter results in a nominal video output swing at terminal O between approximately 5.5 volts (peak white) and 2.5 volts (sync peak).

Under no-signal conditions, transistors 57 and 59 of the differential amplifier draw equal currents. To assure that video signal excursions in the black direction do not drive transistor 59 into cutoff, the current from source resistor 62 available to current source transistor 60 is increased with swings toward black by lessening the current diverted by feedback transistor 78 in response to the amplifier output potential drop. Sufficient additional current is made available to assure that at sync peaks (and beyond) transistor 59 remains in a conducting state.

What is claimed is:

1. In a television receiver, provided with a source of energizing potential having positive and negative terminals, and including a synchronous video detector for recovering composite video signals occupying a given pass band from a modulated IF carrier wave input, said detector including a signal multiplier, responsive to said modulated IF carrier wave input and to reference signals derived from said modulated IF carrier wave input, and formed by an array of NPN transistors realized in integrated circuit form on a common substrate; apparatus comprising the combination of:

a load resistor for said signal multiplier connected between the interconnected collector electrodes of a pair of said NPN signal multiplier transistors and said positive source terminal;

a voltage divider including a pair of divider resistors serially connected between said interconnected collector electrodes and said negative source terminal;

a differential amplifier including a load resistor, and first and second NPN amplifier transistors, each having base, emitter and collector electrodes; said first amplifier transistor having its base electrode connected to the junction of said divider resistors, having its collector electrode connected to said positive source terminal, and having its emitter electrode direct current conductively connected to the emitter electrode of said second amplifier transistor; said load resistor for said differential amplifier being connected between the collector electrode of said second amplifier transistor and said positive source terminal;

a level shifting circuit including a level shifting resistor connected in series with the collector-emitter path of a normally conductive NPN transistor between the collector electrode of said second amplifier transistor and said negative source terminal; and an active low pass filter including a capacitor, and an NPN emitter-follower transistor having its base electrode connected via said level shifting resistor to the collector electrode of said second amplifier transistor, having its collector electrode connected to said positive source terminal, and having its emitter electrode connected to a video signal output terminal, and via said capacitor to the collector electrode of said second amplifier transistor.

2. Apparatus in accordance with claim 1, wherein a first passive low pass filter is formed by said load resistor for said signal multiplier and the stray capacitance appearing at said interconnected collector electrodes, and a second passive low pass filter is formed by said load resistor for said differential amplifier and the stray capacitance appearing at the collector electrode of said second amplifying transistor; and wherein the frequency response characteristics of said first and second passive low pass filters and said active low pass filter each exhibit a break point at a respective frequency lying between said given pass band and the second subharmonic of the picture carrier frequency of said IF carrier wave.

3. Apparatus in accordance with claim 2 wherein said load resistors, said voltage divider, said differential amplifier, said level shifting circuit and said active low pass filter are all realized in integrated circuit form on said common substrate.

4. Apparatus in accordance with claims 1, 2 or 3 also including:

first and second current source resistors;

a first NPN current source transistor having a base electrode coupled to receive a bias potential, a collector electrode connected to the emitter electrode of said first amplifier transistor, and an emitter electrode connected via said first current source resistor to said negative source terminal;

a second NPN current source transistor having a base electrode coupled to receive a bias potential, a collector electrode connected to the emitter electrode of said second amplifier transistor, and an emitter electrode connected via said second current source resistor to said negative source terminal; and an NPN current diverting transistor having a base electrode coupled to the emitter electrode of said emitter-follower transistor, a collector electrode connected to said positive source terminal, and an emitter electrode connected to the emitter electrode of said first current source transistor;

wherein the direct current conductive connection of the emitter electrode of said first amplifier transistor to the emitter electrode of said second amplifier transistor is effected via a resistor.

5. Apparatus in accordance with claim 4 wherein said composite video signals appear across said first-named load resistor with a given polarity; said apparatus also including:

an additional load resistor for said signal multiplier connected between the interconnected collector electrodes of an additional pair of said NPN signal multiplier transistors and said positive source terminal, said composite video signals appearing across said additional load resistor with a polarity opposite to said given polarity;

an additional voltage divider including an additional pair of divider resistors serially connected between said interconnected collector electrodes of said additional pair of signal multiplier transistors and said negative source terminal; and means for connecting the base electrode of said second amplifier transistor to the junction of said additional pair of divider resistors.

6. In a television receiver including a synchronous video detector for recovering composite video signals occupying a given pass band from an IF input comprising modulated picture carrier waves; apparatus comprising the combination of:

a load resistor for said detector forming with stray capacitance associated therewith a first frequency selective circuit having a frequency response characteristic exhibiting a response roll off with increase in frequency with a break point at a frequency located between said given pass band and the second subharmonic of the picture carrier intermediate frequency of said modulated wave input;

a video amplifier responsive to signals appearing across said detector load resistor, said video amplifier having a load resistor forming with stray capacitance associated therewith a second frequency selective circuit having a frequency response characteristic exhibiting a response roll off with increase in frequency with a break point at a frequency located between said given pass band and the second subharmonic of the picture carrier intermediate frequency of said modulated wave input;

a video signal output terminal; and an active low pass filter having an input responsive to signals appearing across said amplifier load resistor and an output coupled to said video signal output terminal, said active low pass filter having a frequency response characteristic exhibiting a response roll off with increase in frequency with a break point at a frequency located between said given pass band and the second subharmonic of the picture carrier intermediate frequency of said modulated wave input, and exhibiting a response null at a frequency in the vicinity of said picture carrier intermediate frequency.

7. Apparatus in accordance with claim 6 wherein said frequency response characteristic of said active low pass filter exhibits a response boost in the vicinity of the upper limit of said given pass band.

8. Apparatus in accordance with claims 6 or 7 wherein said video detector, said video amplifier, and said active filter employ as active devices only transistors of the NPN type, with all of said NPN transistors realized in integrated circuit form on a common substrate.

* * * * *